(12) United States Patent
Sasaki et al.

(10) Patent No.: US 9,018,826 B2
(45) Date of Patent: Apr. 28, 2015

(54) MESA-TYPE QUARTZ-CRYSTAL VIBRATING PIECE AND QUARTZ CRYSTAL DEVICE

(75) Inventors: Hiroyuki Sasaki, Saitama (JP); Kenji Shimao, Saitama (JP); Manabu Ishikawa, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 465 days.

(21) Appl. No.: 13/584,829

(22) Filed: Aug. 14, 2012

(65) Prior Publication Data

US 2013/0043771 A1 Feb. 21, 2013

(30) Foreign Application Priority Data

Aug. 17, 2011 (JP) .................................. 2011-178554

(51) Int. Cl.
| | |
|---|---|
| H01L 41/053 | (2006.01) |
| H01L 41/047 | (2006.01) |
| H03H 9/05 | (2006.01) |
| H03H 9/19 | (2006.01) |
| H03H 9/10 | (2006.01) |
| H03H 9/09 | (2006.01) |

(52) U.S. Cl.
CPC .............. *H03H 9/0595* (2013.01); *H03H 9/19* (2013.01); *H03H 9/1035* (2013.01); *H03H 9/09* (2013.01)

(58) Field of Classification Search
USPC .................................................. 310/344, 348
See application file for complete search history.

(56) References Cited

U.S. PATENT DOCUMENTS

| | | | | |
|---|---|---|---|---|
| 5,198,716 A | * | 3/1993 | Godshall et al. | 310/349 |
| 8,278,798 B2 | * | 10/2012 | Ichikawa | 310/312 |
| 8,405,286 B2 | * | 3/2013 | Shimao et al. | 310/361 |
| 8,773,005 B2 | * | 7/2014 | Mizusawa et al. | 310/344 |
| 2013/0063001 A1 | * | 3/2013 | Takahashi et al. | 310/344 |
| 2013/0214648 A1 | * | 8/2013 | Yamada et al. | 310/366 |
| 2013/0328449 A1 | * | 12/2013 | Takahashi et al. | 310/344 |

FOREIGN PATENT DOCUMENTS

JP 2003-017978 1/2003

* cited by examiner

*Primary Examiner* — Thomas Dougherty
(74) *Attorney, Agent, or Firm* — Jianq Chyun IP Office

(57) ABSTRACT

A mesa-type quartz-crystal vibrating piece includes a vibrator in a quadrangular shape with both main surfaces, a pair of excitation electrodes on both the main surfaces, a thin portion outside of the quadrangular shape, and a pair of extraction electrodes. The thin portion has a thickness thinner than a thickness of the vibrator. The pair of extraction electrodes are extracted from the excitation electrodes to a predetermined direction. A center of a first length in the predetermined direction of the excitation electrode is decentered from a center of a second length in the predetermined direction. The second length includes a length of the vibrator and a length of the thin portion. The center of the first length is decentered toward an opposite side of the extraction electrode by 25 μm to 65 μm.

10 Claims, 4 Drawing Sheets

US 9,018,826 B2

MESA-TYPE QUARTZ-CRYSTAL VIBRATING PIECE AND QUARTZ CRYSTAL DEVICE

CROSS-REFERENCE TO RELATED APPLICATIONS

This application claims the priority benefit of Japan application serial no. 2011-178554, filed on Aug. 17, 2011. The entirety of the above-mentioned patent application is hereby incorporated by reference herein and made a part of this specification.

TECHNICAL FIELD

This disclosure related to mesa-type crystal units with structures that include thick portions, which are thicker than their peripheral portions and used as vibrators, in the centers of quartz-crystal vibrating pieces.

DESCRIPTION OF THE RELATED ART

Nowadays, there is a need for a further downsized quartz crystal device such as a crystal unit as electronic devices are downsized. The downsized electronic devices make distances between excitation electrodes and a region that supports and secures a quartz-crystal vibrating piece narrow. In view of this, a conductive adhesive and a supporting portion may adversely affect a vibration of the quartz-crystal vibrating piece.

Japanese Unexamined Patent Application Publication No. 2003-17978 discloses a quartz-crystal vibrating piece. The quartz-crystal vibrating piece includes a piezoelectric vibrating region that has the whole length of the quartz-crystal vibrating piece excluding an electrically bonded region where conductive adhesive is applied. The piezoelectric vibrating region has the center of the length (in the X axis direction) that coincides with the center of the length (in the X axis direction) of surfaces of excitation electrodes. This consequently provides a CI value sufficient for oscillation, thus ensuring an advantageous effect to avoid an adverse influence on vibration of the quartz-crystal vibrating piece.

However, inventors repeated experiments and found followings. Regardless of distances between the centers of the excitation electrodes and the conductive adhesive, the CI value was decreased if the centers of the respective lengths of the excitation electrodes are decentered from the center of the length of the quartz-crystal vibrating piece by a given amount.

SUMMARY

Therefore, the present invention is to provide a quartz-crystal vibrating piece and a quartz crystal device that reduce a CI value in a mesa-type quartz-crystal vibrating piece.

One aspect of this disclosure is directed to a mesa-type quartz-crystal vibrating piece. The mesa-type quartz-crystal vibrating piece includes a vibrator in a quadrangular shape with both main surfaces, a pair of excitation electrodes on both the main surfaces, a thin portion outside of the quadrangular shape, and a pair of extraction electrodes. The thin portion has a thickness thinner than a thickness of the vibrator. The pair of extraction electrodes is extracted from the excitation electrodes to a predetermined direction. A center of a first length in the predetermined direction of the excitation electrode is decentered from a center of a second length in the predetermined direction. The second length includes a length of the vibrator and a length of the thin portion. The center of the first length is decentered toward an opposite side of the extraction electrode by 25 μm to 65 μm.

This disclosure provides the CI value sufficient for oscillation in the downsized quartz-crystal vibrating piece. This disclosure also provides the quartz-crystal vibrating piece or the quartz crystal device that avoids the adverse influence on vibration of the quartz-crystal vibrating piece.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Figure 1A:
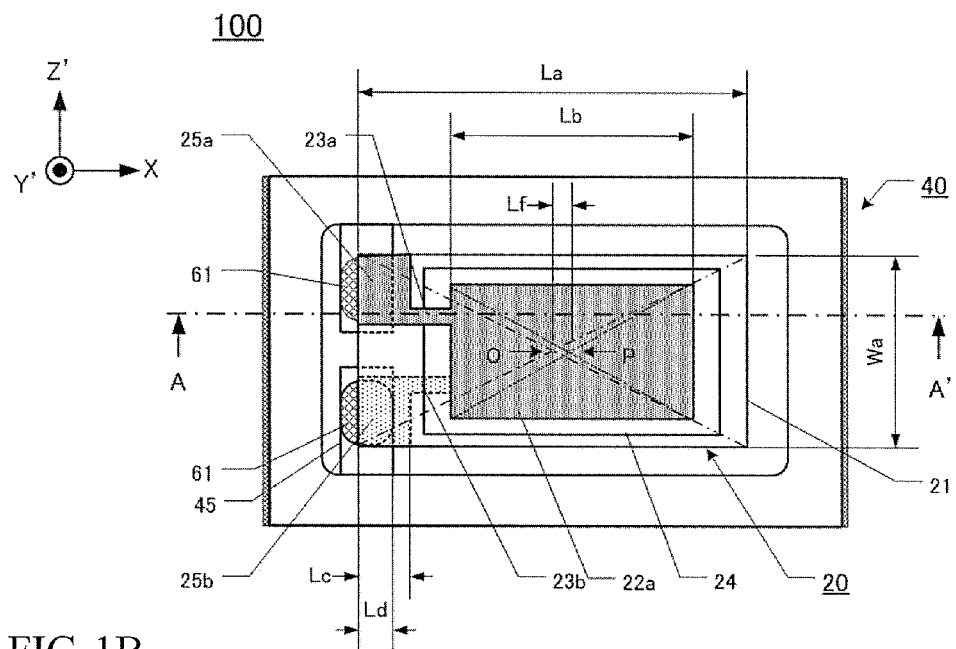
FIG. 1A is a plan view of a first crystal unit 100 without a lid according to a first embodiment.
Figure 1B:
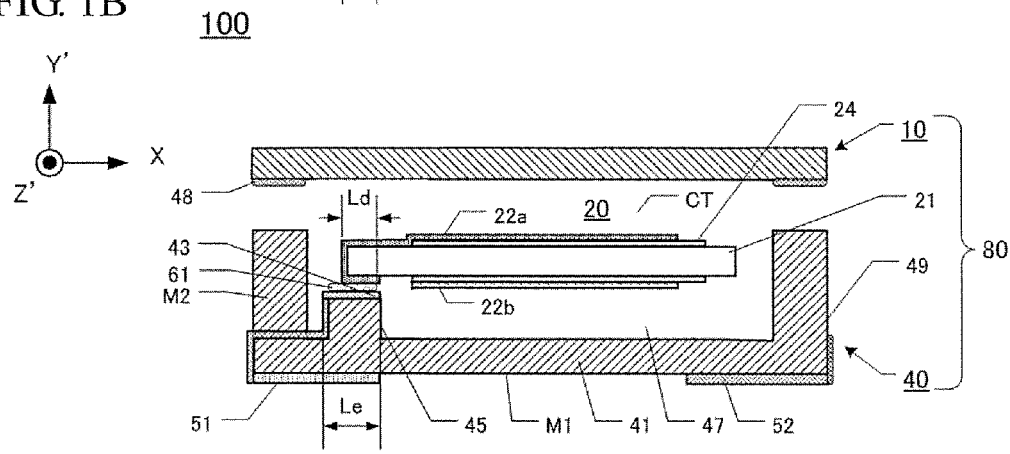
FIG. 1B is a cross-sectional view taken along the line A-A' of the first crystal unit 100.

Overall Configuration of a First Crystal Unit 100 According to a First Embodiment The overall configuration of the first crystal unit 100 will be described by referring to FIGS. 1A and 1B. FIG. 1A is a plan view of the first crystal unit 100 without a first lid 10 according to the first embodiment. FIG. 1B is a cross-sectional view taken along the line A-A' of the first crystal unit 100 before the first lid 10 and a ceramic base plate 40 are bonded together.

Here, the quartz-crystal vibrating piece employs an AT-cut quartz-crystal vibrating piece 20. That is, the AT-cut quartz-crystal vibrating piece has a principal surface (in the Y-Z plane) that is tilted by 35° 15' about the Y-axis of the crystal coordinate system (XYZ) in the direction from the Z-axis to the Y-axis around the X-axis. Accordingly in the first embodiment, the new axises tilted with reference to the axis directions of the AT-cut quartz-crystal vibrating piece are denoted as the Y' axis and the Z' axis. Therefore, in the first embodiment, the longitudinal direction of the first crystal unit 100 is referred as the X axis direction, the height direction of the first crystal unit 100 is referred as the Y' axis direction, and the direction perpendicular to the X axis and the Y' axis directions is referred to as the Z' axis direction. This configuration is similar to that of a second embodiment below.

As illustrated in FIG. 1B, the first crystal unit 100, which is surface-mount type, includes the first lid 10, the ceramic base plate 40 with insulation property, and the quartz-crystal vibrating piece 20. The first lid 10 is made of metal such as kovar. The ceramic base plate 40 includes a base recess 47. The quartz-crystal vibrating piece 20 is placed on the ceramic base plate 40.

The quartz-crystal vibrating piece 20 includes an AT-cut crystal element 21 in a rectangular shape. The crystal element 21 has a thin peripheral portion, and its central region is a vibrating portion 24, which has a larger thickness dimension than that of the peripheral portion. The vibrating portion 24 includes a pair of excitation electrodes 22a and 22b on both main surfaces around its center. The electrodes 22a and 22b each have a rectangular shape with a smaller area than that of the vibrating portion 24. That is, the quartz-crystal vibrating piece 20 is a so-called mesa-type quartz-crystal vibrating piece that has the central region that is thicker than the peripheral portion of the crystal element 21.

The crystal element 21 includes the excitation electrode 22a on its top surface (at the +Y' side). At the excitation electrode 22a, an extraction electrode 23a is formed to one end at the −X side, while an connecting electrode 25a is formed in the one end at the −X side and extends from the top surface to the bottom surface (at the −Y' side) of the crystal element 21. From the excitation electrode 22b on the bottom surface of the crystal element 21, an extraction electrode 23b and the connecting electrode 25b extend to the other end at the −X side. The connecting electrodes 25a and 25b of the quartz-crystal vibrating piece 20 are electrically bonded to base connecting electrodes 43 via conductive adhesives 61 on a pedestal 45 in a cavity CT.

Here, the quartz-crystal vibrating piece 20 has a length La of 900 μm to 1400 μm in the X axis direction, and a width Wa of 600 μm to 700 μm in the Z' axis direction. The connecting electrodes 25a and 25b each have a length Lc of 150 μm to 250 μm in the X axis direction. The connecting electrodes 25a and 25b each have a length Ld, where bonded to the conductive adhesive 61, of 100 μm to 150 μm. The conductive adhesive 61 has a length Le of 200 μm to 250 μm in the X axis direction.

The excitation electrodes 22a and 22b, the extraction electrodes 23a and 23b, and the connecting electrodes 25a and 25b employ, for example, a nickel layer or a chromium layer as a foundation layer, and a gold layer on a top surface of the foundation layer. The foundation layer has a thickness of, for example, 0.01 μm to 0.1 μm, while the gold layer has a thickness of, for example, 0.1 μm to 2 μm.

The ceramic base plate 40 includes a bottom surface ceramic layer 41, a wall ceramic layer 49, and a pedestal bottom surface ceramic layer 45. These ceramic layers 41, 49, and 45 are formed with punched-out green sheets, which include alumina-based ceramic powder, binder, and the like. The ceramic base plate 40, which includes the plurality of ceramic layers 41, 45 and 49, defines the cavity CT. The AT-cut quartz-crystal vibrating piece 20 is mounted inside the cavity CT. The ceramic base plate 40 is formed of the plurality of ceramic layers, which are laminated and sintered together. The ceramic base plate 40 includes surface-mountable external electrodes 51 and 52 on an outer bottom surface M1.

The first lid 10 has a sealing material 48, which is uniformly formed on the outer periphery of the first lid 10. For example, the sealing material 48 is made of material such as silver solder and kovar.

The AT-cut quartz-crystal vibrating piece 20 is mounted on the base connecting electrode 43 of the pedestal 45 in the ceramic base plate 40, and bonded to the base connecting electrode 43 via the conductive adhesive 61. Next, the first lid 10 is stacked on the ceramic base plate 40, which houses the AT-cut quartz-crystal vibrating piece 20. The ceramic base plate 40 and the first lid 10 are then placed inside a chamber (not shown) that is evacuated or filled with an inert gas. The ceramic base plate 40 and the first lid 10 are sealed in an evacuated or inert gas environment, thus forming a package 80.

Figure 2:
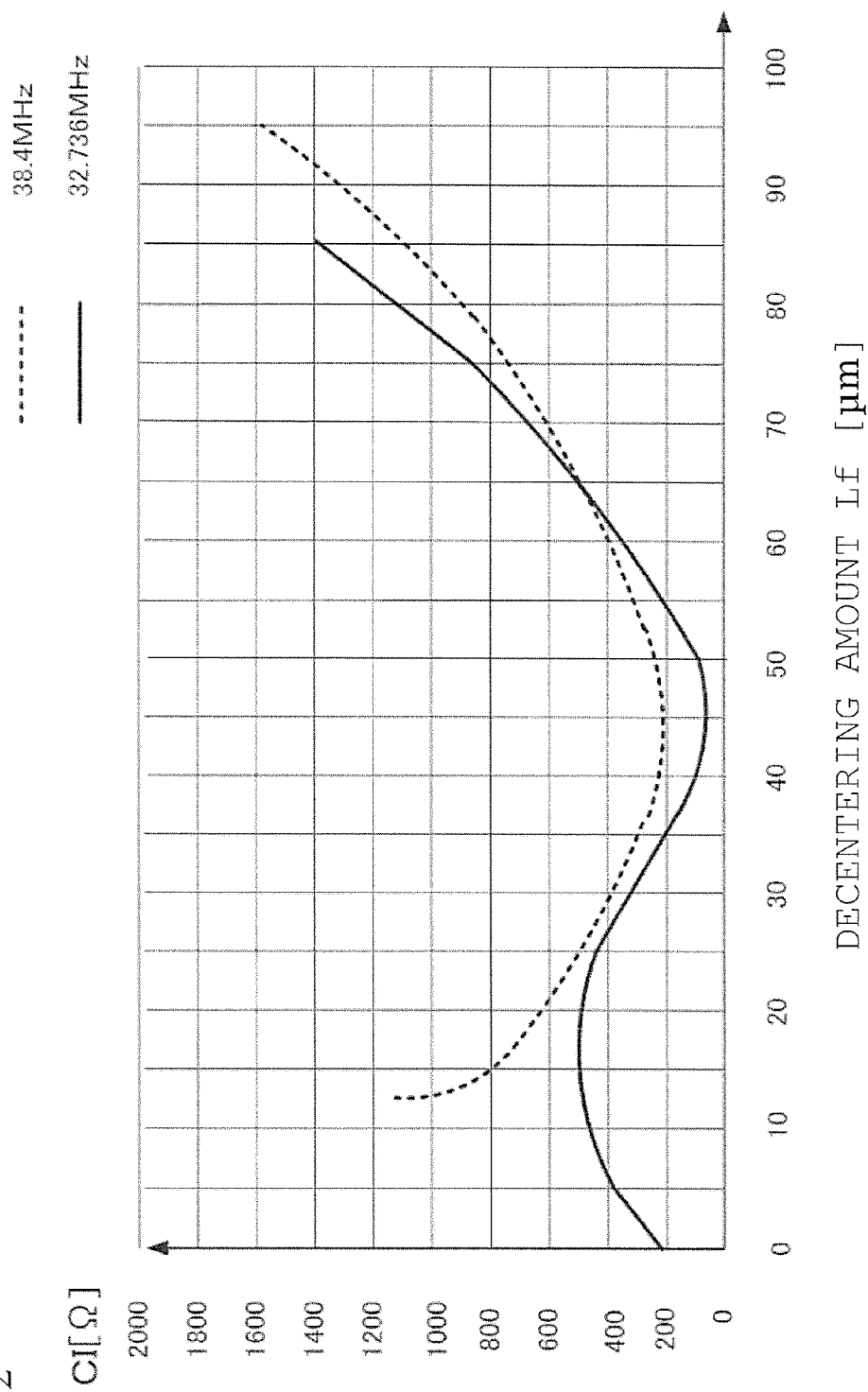
FIG. 2 is a graph illustrating a relationship between a CI value and a decentering amount between the centers of respective lengths of excitation electrodes and the center of the length of the quartz-crystal vibrating piece.

FIG. 2 is a graph illustrating a relationship between a CI value and a decentering amount Lf between the center of a length of the excitation electrode 22 (in the X axis direction) and the center of the length of the quartz-crystal vibrating piece 20 (in the X axis direction). The used quartz-crystal vibrating piece 20 employed two oscillation frequencies of 38.4 MHz and 32.736 MHz while changing a thickness (in the Y' axis direction) of the vibrating portion 24. The center point P of the area that forms the mesa-type vibrating portion 24 is decentered from the center point O (see FIGS. 1A and 1B) of the length of the quartz-crystal vibrating piece 20. The excitation electrode 22 was formed in the center corresponding to the vibrating portion 24. Thus, the center point P of the excitation electrode 22 is also decentered by the same amount as that of the vibrating portion 24. An experiment on the vibrating portion 24 with 38.4 MHz was carried out while changing the decentering amount Lf (see FIGS. 1A and 1B) from 10 μm to 95 μm. An experiment on the vibrating portion 24 with 32.736 MHz was carried out while changing the decentering amount Lf from 0 μm to 90 μm.

In the experiments, CI values of the quartz-crystal vibrating pieces 20 with 38.4 MHz and 32.736 MHz resulted as illustrated in FIG. 2. That is, in the case where the decentering amount Lf from the center point O of the length in the quartz-crystal vibrating piece 20 to the center point P of the length in the excitation electrode is 25 μm to 65 μm toward the opposite side (the +X side) of the extraction electrode 23, the CI value indicated equal to or less than 500 Ω. Regardless of the length Ld of the conductive adhesive 61, where bonded to the connecting electrodes 25a and 25b, when the center point P of the length in the excitation electrode was decentered from the center point O of the length in the quartz-crystal vibrating piece 20 toward the opposite side of the extraction electrode by 25 μm to 65 μm, the CI value indicated equal to or less than 500 Ω.

In view of this, the center point P of the length Lb in the X axis direction of the excitation electrodes 22a and 22b illustrated in FIGS. 1A and 1B is decentered from the center point O of the length La in the X axis direction of the quartz-crystal vibrating piece 20 toward the opposite side (the +X axis side) of the extraction electrode side by 25 μm to 65 μm. The reason is that the CI value takes the minimum value within a range of the decentering amount Lf of 25 μm to 65 μm toward the +X axis side.

Figure 3:
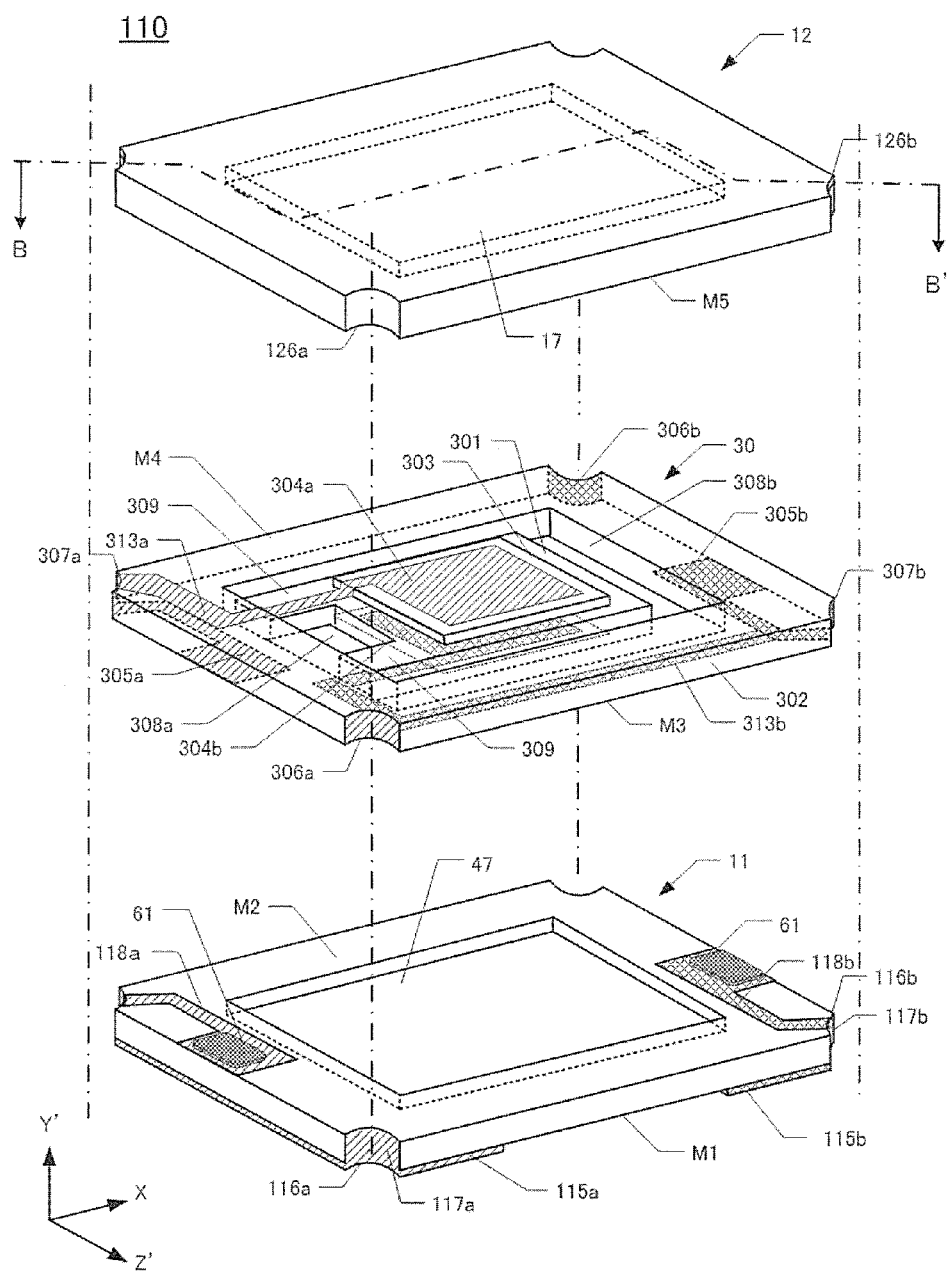
FIG. 3 is an exploded perspective view of a second crystal unit 110 according to a second embodiment.
Figure 4A:
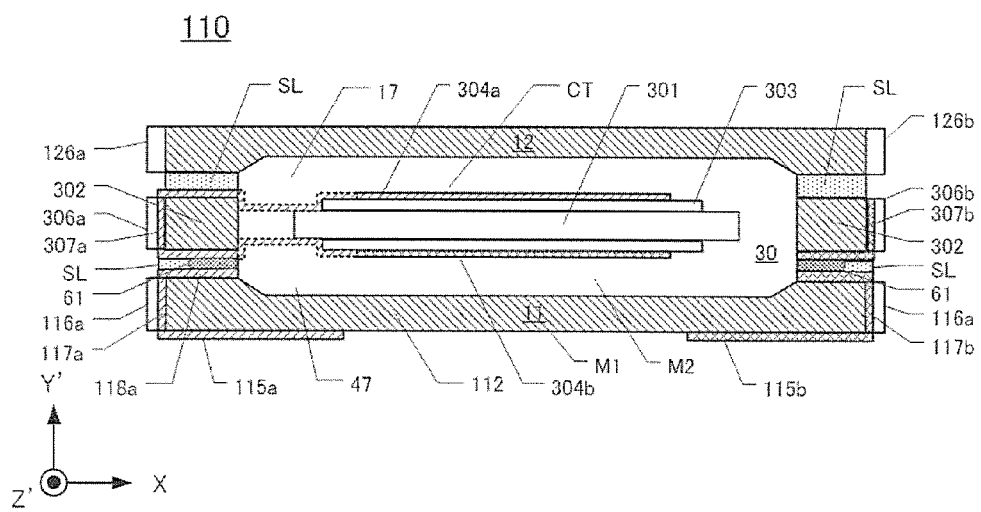
FIG. 4A is a cross-sectional view taken along the line B-B' of FIG. 3.
Figure 4B:
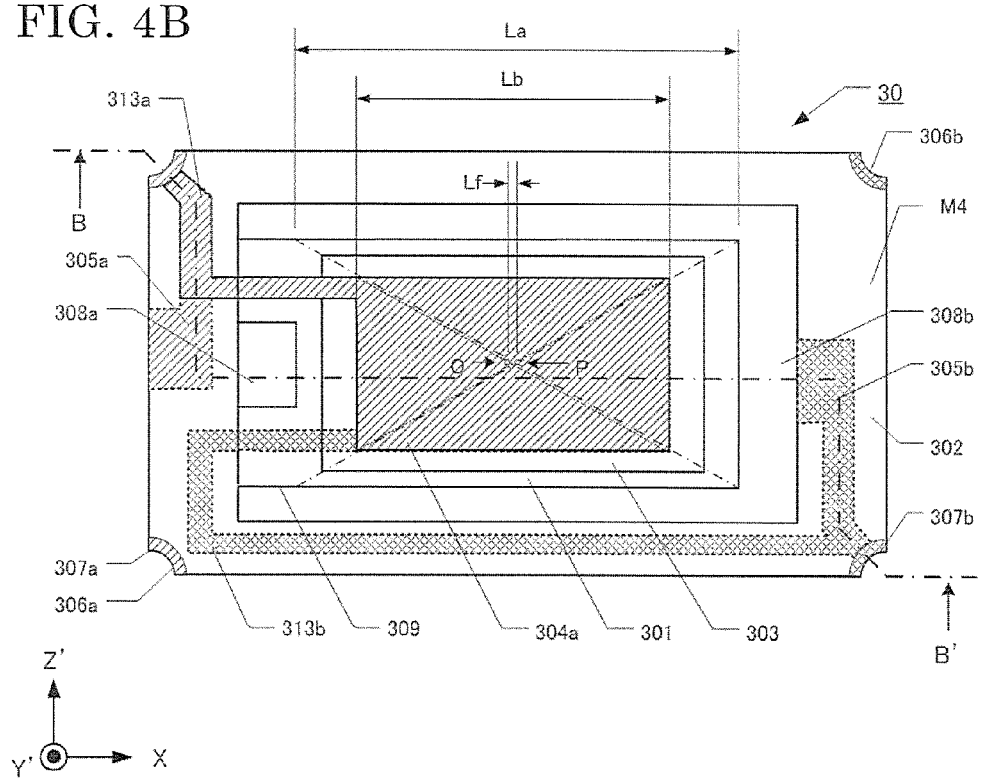
FIG. 4B is a plan view of a quartz-crystal frame 30 of the second crystal unit 110.

In order to further decrease the CI value, the decentering amount Lf may be set within the following range. In the case where the decentering amount Lf is 35 μm to 55 μm, the CI value indicates more preferred value equal to or less than 300 Ω. Further, in the case where the decentering amount Lf is 40 μm to 50 μm, the CI value indicates approximately the minimum value, and then this is more preferred. Overall configuration of a second crystal unit 110 according to a second embodiment The overall configuration of the second crystal unit 110 will be described by referring to FIGS. 3, 4A, and 4B. FIG. 3 is an exploded perspective view of the second crystal unit 110 from a second lid 12. FIG. 4A is a cross-sectional view taken along the line B-B' of FIG. 3 after a quartz-crystal frame 30, a second base plate 11, and the second lid 12 are bonded together. FIG. 4B is a plan view illustrating the quartz-crystal frame 30 with an excitation electrode 304a.

The second crystal unit 110 differs from the first crystal unit 100 in that the quartz-crystal frame 30 is disposed at the second crystal unit 110 instead of the quartz-crystal vibrating piece 20 in the first crystal unit 100. The second crystal unit 110 is also different in that the second crystal unit 110 includes the second base plate 11 instead of the ceramic base plate 40. Like reference numerals designate corresponding or identical elements in the first embodiment, and therefore such elements will not be further elaborated here. Then, differences will be described.

As illustrated in FIG. 3, the second crystal unit 110 includes the second lid 12 with a lid recess 17, the second base plate 11 with the base recess 47, and the quartz-crystal frame 30, which is AT-cut and placed on the second base plate 11. The second base plate 11 and the second lid 12 are made of quartz-crystal material or glass.

The quartz-crystal frame 30 includes a crystal element 301, which is AT-cut and in a rectangular shape, and an outer frame 302, which surrounds the crystal element 301. Between the crystal element 301 and the outer frame 302, a void 308a and a void 308b are formed to pass through in the Y' axis direction. A region, where the void 308a and the void 308b are not formed, forms a connecting portion 309 between the crystal element 301 and the outer frame 302.

The crystal element 301 includes a thin peripheral portion and a central region, which forms a vibrating portion 303, with a larger thickness dimension than that of the peripheral portion. On both main surfaces of the vibrating portion 303 in a rectangular shape around its center, a pair of excitation electrodes 304a and 304b is formed in a rectangular shape with smaller areas than that of the vibrating portion 303. That is, the quartz-crystal frame 30 is a so-called mesa-type quartz-crystal vibrating piece that has the central region that is thicker than the peripheral portion of the crystal element 301.

The used vibrating portion 303, which are different in thickness (in the Y' axis direction), employed two oscillation frequencies of 38.4 MHz and 32.736 MHz. From the excitation electrode 304a, an extraction electrode 313a and a connecting electrode 305a extend to one end at the −X side on the bottom surface (at the −Y' side) of the crystal element 301. From the excitation electrode 304b, an extraction electrode 313b extends to the other end at the +X side on the bottom surface (at the −Y' side) of the crystal element 301 while a connecting electrode 305b is formed at the other end at +X side on the bottom surface (at the −Y' side) of the crystal element 301. When the quartz-crystal frame 30 is bonded to the second base plate 11 with a sealing material SL, the quartz-crystal frame 30 is electrically bonded to base connecting electrodes 118a and 118b via the connecting electrodes 305a and 305b and conductive adhesives 61.

The second base plate 11 includes the connecting electrode 118a and the connecting electrode 118b on a bonding surface M2. The connecting electrode 118a is electrically connected to an external electrode 115a and a side-surface electrode 117a. The connecting electrode 118b is electrically connected to an external electrode 115b and a side-surface electrode 117b together. The conductive adhesives 61 are formed on the connecting electrodes 118a and 118b.

Further, the quartz-crystal frame 30 has four corners where quartz-crystal castellations 306a and 306b are formed. A quartz-crystal side-surface electrode 307a is formed on the quartz-crystal castellation 306a. The quartz-crystal side-surface electrode 307a is connected to the extraction electrode 313a and the connecting electrode 305a. Similarly, a quartz-crystal side-surface electrode 307b is formed on the quartz-crystal castellation 306b. The quartz-crystal side-surface electrode 307b is connected to the extraction electrode 313b and the connecting electrode 305b.

The second base plate 11 includes a mounting surface M1 and the bonding surface M2. On the mounting surface M1 of the second base plate 11, the pair of the external electrodes 115a and 115b are formed. At the four corners of the second base plate 11, side castellations 116a and 116b are formed. In the side castellation 116a, the side-surface electrode 117a, which is connected to the external electrode 115a, is formed. In the side castellation 116b, the side-surface electrode 117b, which is connected to the external electrode 115b, is formed.

On the bonding surface M2, the connecting electrode 118a, which is connected to the side-surface electrode 117a, is formed. The side-surface electrode 117b is connected to the connecting electrode 118b.

The second lid 12 includes a bonding surface M5. At the four corners of the second lid 12, side castellations 126a and 126b are formed.

As illustrated in FIG. 4A, the sealing material SL and the conductive adhesive 61 bond the quartz-crystal frame 30 and the second base plate 11 together by pressing and heating the second base plate 11 and the quartz-crystal frame 30 to 300 to 400° C. in nitrogen gas or in a vacuum. At the same time, the connecting electrodes 305a and 305b of the quartz-crystal frame 30 are electrically connected to the base connecting electrodes 118a and 118b.

The quartz-crystal frame 30 and the second lid 12 are bonded with the sealing material SL. The second base plate 11 and the second lid 12 are bonded to the quartz-crystal frame 30, thus forming the cavity CT. The cavity CT is evacuated or filled with an inert gas inside.

The sealing material SL is made of low-melting-point glass including, for example, vanadium. The low-melting-point glass is resistant to water and humidity, thus preventing water in the air from entering the cavity and from damaging the hermetic seal of the cavity. The vanadium-based low-melting-point glass is formulated as a paste mixed with binder and solvent. This glass is bonded to another member by firing and cooling. The vanadium-based low-melting-point glass has high reliability in, for example, air tightness at bonding and resistance to water and humidity.

As illustrated in FIG. 4B, the center point P of the length Lb in the X axis direction of the excitation electrode 304a in the quartz-crystal frame 30 is decentered from the center point O of the length La in the X axis direction of the crystal element 301 toward the opposite side (the +X side) of the extraction electrode by 25 μm to 65 μm. Then, the center point P of the area that forms the mesa-type vibrating portion 303 is decentered from the center point O (see FIG. 4B) of the crystal element 301. The excitation electrode 304 is formed in the center corresponding to the vibrating portion 303. Thus, the center point P of the excitation electrode 304 is also decentered by the same amount as that of the vibrating portion 303. That is, a decentering amount Lf from the center point O of the crystal element 301 to the center point P of the length of the excitation electrode is 25 μm to 65 μm toward the +X side. The reason is that a CI value takes the minimum value within the range as described in FIG. 2.

Representative embodiments have been described in detail above. As evident to those skilled in the art, the present invention may be changed or modified in various ways within the technical scope of the invention. For example, the present invention is applicable to an oscillator that includes an IC with an oscillation circuit or the like in a package as a quartz crystal device. Also, the following modifications of the invention may be effected without departing from the spirit and scope of the novel concepts of the disclosure.

A mesa-type quartz-crystal vibrating piece according to a first modification may further include a connecting electrode in the thin portion. The connecting electrode is electrically connected to the extraction electrode. Conductive adhesive is applied over the connecting electrode. The vibrator with the thin portion may have the length of 900 μm to 1400 μm in the predetermined direction. The connecting electrode may have a length of 150 μm to 250 μm in the predetermined direction. The conductive adhesive may have a length of 100 μm to 150 μm in the predetermined direction.

A mesa-type quartz-crystal vibrating piece according to a second modification may include a ring-shaped frame body that surrounds the thin portion via a void; and a connecting portion that connects the thin portion and the ring-shaped frame body. A mesa-type quartz-crystal vibrating piece according to a third modification may include a vibrator that vibrates at one of 38.4 MHz and 32.736 MHz.

A quartz crystal device according to a fourth modification may include: a base plate on which the mesa-type quartz-crystal vibrating piece is placed; and a lid plate that forms a cavity together with the base plate. The cavity houses the mesa-type quartz-crystal vibrating piece. A quartz crystal device according to a fifth modification may include: a base plate bonded to one surface of the ring-shaped frame body; and a lid plate bonded to another surface of the ring-shaped frame body. The lid plate forms a cavity together with the base plate. The cavity houses the mesa-type quartz-crystal vibrating piece.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A mesa-type quartz-crystal vibrating piece, comprising:
   a vibrator, being in a quadrangular shape with both main surfaces;
   a pair of excitation electrodes, disposed on both the main surfaces;
   a thin portion, being outside of the quadrangular shape, the thin portion having a thickness thinner than a thickness of the vibrator; and
   a pair of extraction electrodes, extracted from the excitation electrodes to a predetermined direction, wherein,
   a center of a first length in the predetermined direction of the excitation electrode is decentered from a center of a second length in the predetermined direction,
   the second length including a length of the vibrator and a length of the thin portion,
   the center of the first length being decentered toward an opposite side of the extraction electrode by 25 μm to 65 μm.

2. The mesa-type quartz-crystal vibrating piece according to claim 1 further comprising:
   a connecting electrode, disposed in the thin portion, the connecting electrode being electrically connected to the extraction electrode, conductive adhesive being applied over the connecting electrode, wherein,
   the vibrator with the thin portion have the length of 900 μm to 1400 μm in the predetermined direction,
   the connecting electrode has a length of 150 μm to 250 μm in the predetermined direction, and
   the conductive adhesive has a length of 100 μm to 150 μm in the predetermined direction.

3. The mesa-type quartz-crystal vibrating piece according to claim 1 further comprising:
   a ring-shaped frame body that surrounds the thin portion via a void; and
   a connecting portion that connects the thin portion and the ring-shaped frame body.

4. The mesa-type quartz-crystal vibrating piece according to claim 1, wherein,
   the vibrator vibrates at one of 38.4 MHz and 32.736 MHz.

5. The mesa-type quartz-crystal vibrating piece according to claim 2, wherein,
   the vibrator vibrates at one of 38.4 MHz and 32.736 MHz.

6. The mesa-type quartz-crystal vibrating piece according to claim 3, wherein,
   the vibrator vibrates at one of 38.4 MHz and 32.736 MHz.

7. A quartz crystal device, comprising:
   the mesa-type quartz-crystal vibrating piece according to claim 1;
   a base plate on which the mesa-type quartz-crystal vibrating piece is placed; and
   a lid plate that forms a cavity together with the base plate, the cavity housing the mesa-type quartz-crystal vibrating piece.

8. A quartz crystal device, comprising:
   the mesa-type quartz-crystal vibrating piece according to claim 2;
   a base plate on which the mesa-type quartz-crystal vibrating piece is placed; and
   a lid plate that forms a cavity together with the base plate, the cavity housing the mesa-type quartz-crystal vibrating piece.

9. A quartz crystal device, comprising:
   the mesa-type quartz-crystal vibrating piece according to claim 4;
   a base plate on which the mesa-type quartz-crystal vibrating piece is placed; and
   a lid plate that forms a cavity together with the base plate, the cavity housing the mesa-type quartz-crystal vibrating piece.

10. A quartz crystal device, comprising:
    the mesa-type quartz-crystal vibrating piece according to claim 3;
    a base plate bonded to one surface of the ring-shaped frame body; and
    a lid plate bonded to another surface of the ring-shaped frame body, the lid plate forming a cavity together with the base plate, the cavity housing the mesa-type quartz-crystal vibrating piece.

* * * * *